US012665576B2

(12) United States Patent
Banin et al.

(10) Patent No.: US 12,665,576 B2
(45) Date of Patent: Jun. 23, 2026

(54) APPARATUS, SYSTEM AND METHOD OF PHASE SHIFTING

(71) Applicant: INTEL CORPORATION, Santa Clara, CA (US)

(72) Inventors: Elan Banin, Raanana (IL); Rotem Banin, Even-Yehuda (IL); Ashoke Ravi, Portland, OR (US); Assaf Ben-Bassat, Haifa (IL); Ofir Degani, Nes-Ammin (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/958,340

(22) Filed: Oct. 1, 2022

(65) Prior Publication Data

US 2024/0113696 A1     Apr. 4, 2024

(51) Int. Cl.
| | |
|---|---|
| *H03H 11/16* | (2006.01) |
| *G06F 1/08* | (2006.01) |
| *H04L 27/20* | (2006.01) |

(52) U.S. Cl.
CPC ............... *H03H 11/16* (2013.01); *G06F 1/08* (2013.01); *H04L 27/2067* (2013.01)

(58) Field of Classification Search
CPC ........ H03H 11/16; H03H 11/20; H03H 11/22; H03H 2218/04; H03H 7/18; H03H 7/21; H01P 1/18
USPC .......................... 327/231–235, 238, 254, 255
See application file for complete search history.

(56) References Cited

U.S. PATENT DOCUMENTS

| | | | |
|---|---|---|---|
| 8,938,204 B2 * | 1/2015 | Oishi | ..................... H03B 21/01 |
| | | | 327/119 |
| 9,531,410 B2 | 12/2016 | Nagode et al. | |
| 12,206,376 B2 * | 1/2025 | Shrivastava | ............. H03H 7/20 |
| 12,483,277 B2 * | 11/2025 | Shumaker | ............ H04B 1/0483 |
| 12,531,583 B2 | 1/2026 | Banin et al. | |
| 2011/0243202 A1 | 10/2011 | Lakkis | |
| 2013/0130632 A1 | 5/2013 | Oishi | |
| 2014/0269986 A1 | 9/2014 | Nagode et al. | |
| 2016/0043754 A1 | 2/2016 | Robert et al. | |
| 2018/0139078 A1 | 5/2018 | Mittal et al. | |
| 2023/0318643 A1 | 10/2023 | Banin et al. | |

OTHER PUBLICATIONS

Notice of Allowance for U.S. Appl. No. 17/710,861, mailed on Sep. 23, 2025, 14 pages.
Office Action for U.S. Appl. No. 17/710,861, mailed on Apr. 24, 2025, 22 pages.

* cited by examiner

*Primary Examiner* — Hai L Nguyen
(74) *Attorney, Agent, or Firm* — Shichrur & Co.

(57)     ABSTRACT

For example, a phase shifter may include an input to receive an input clock signal having an input frequency and an input phase. For example, the phase shifter may include a quadrature phase-shift generator configured to generate a first signal and a second signal based on the input clock signal, the first and second signals having the input frequency, wherein a phase of the first signal is based on the input phase, wherein a phase of the second signal is shifted by a quadrature phase-shift relative to the phase of the first signal. For example, the phase shifter may include an output to provide an output based on the first signal and the second signal.

25 Claims, 6 Drawing Sheets

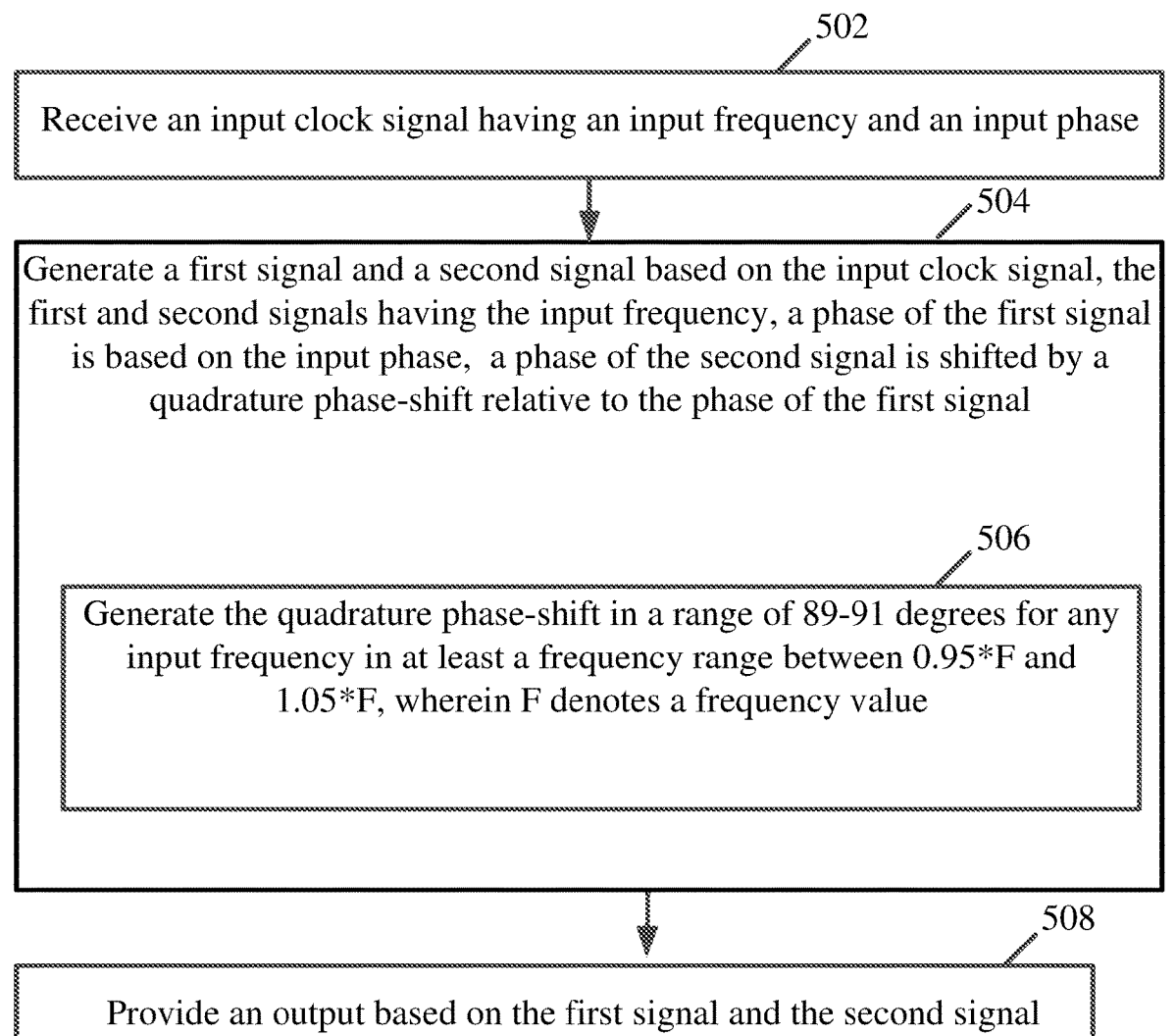

502

Receive an input clock signal having an input frequency and an input phase

504

Generate a first signal and a second signal based on the input clock signal, the first and second signals having the input frequency, a phase of the first signal is based on the input phase, a phase of the second signal is shifted by a quadrature phase-shift relative to the phase of the first signal

506

Generate the quadrature phase-shift in a range of 89-91 degrees for any input frequency in at least a frequency range between 0.95*F and 1.05*F, wherein F denotes a frequency value

508

Provide an output based on the first signal and the second signal

Fig. 5

APPARATUS, SYSTEM AND METHOD OF PHASE SHIFTING

TECHNICAL FIELD

Aspects described herein generally relate to phase shifting.

BACKGROUND

A phase shifter may be configured to generate phase-shifted wireless communication signals, for example, by shifting a phase of a signal, for example, relative to a reference signal.

There is a need for a technical solution to provide an accurate phase shift in an efficient manner.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

FIG. 5 is a schematic flow-chart illustration of a method of phase shifting, in accordance with some demonstrative aspects.

DETAILED DESCRIPTION

Figure 1:
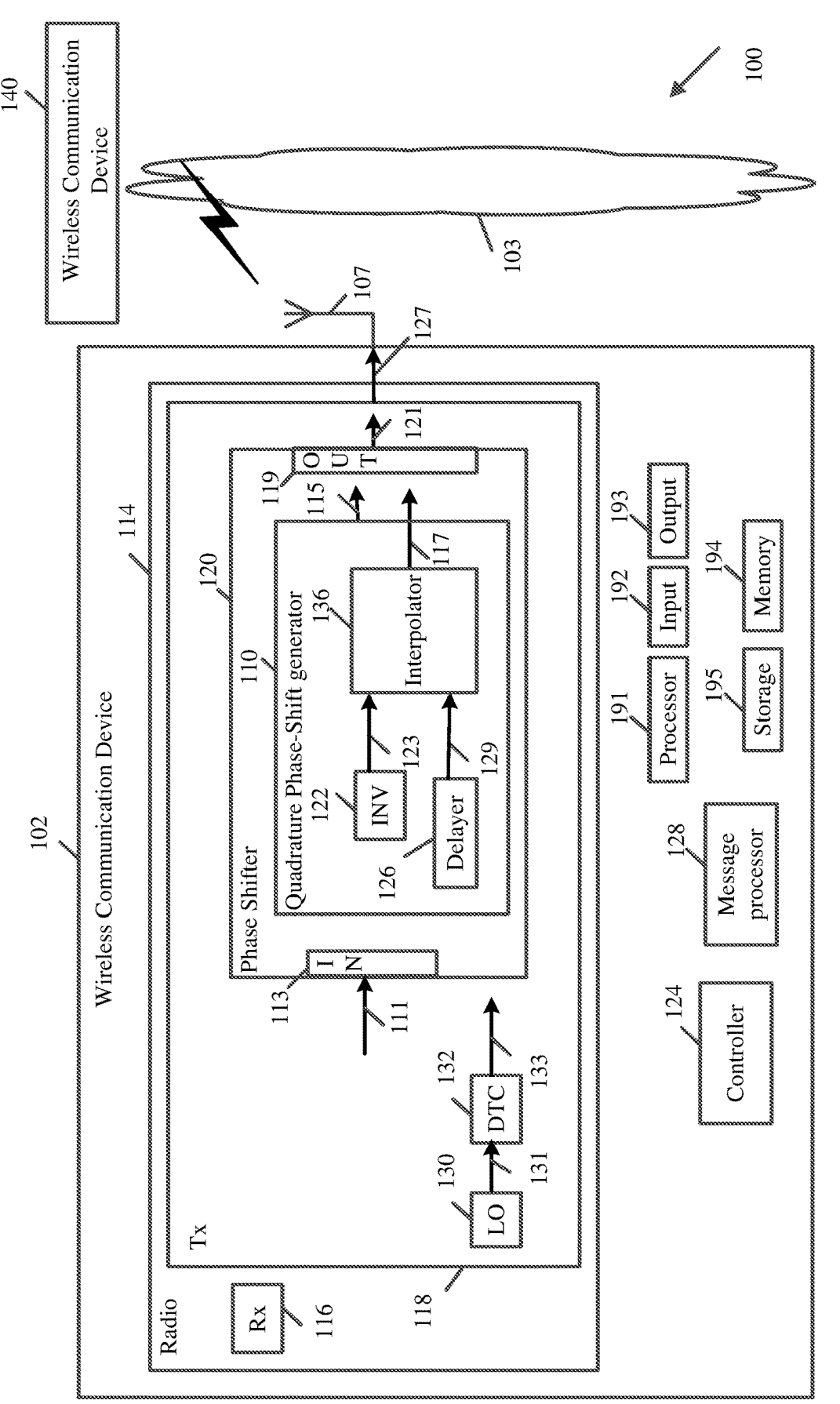
FIG. 1 is a schematic block diagram illustration of a system, in accordance with some demonstrative aspects.

In the following detailed description, numerous specific details are set forth in order to provide a thorough understanding of some aspects. However, it will be understood by persons of ordinary skill in the art that some aspects may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a hand-held device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may be used in conjunction with devices and/or networks operating in accordance with existing IEEE 802.11 standards (including IEEE 802.11-2016 (*IEEE 802.11-2020, IEEE Standard for Information Technology—Telecommunications and Information Exchange between Systems Local and Metropolitan Area Networks—Specific Requirements Part 11: Wireless LAN Medium Access Control (MAC) and Physical Layer (PHY) Specifications, December* 2020)), and/or future versions and/or derivatives thereof, devices and/or networks operating in accordance with existing cellular specifications and/or protocols, e.g., 3rd Generation Partnership Project (3GPP), 3GPP Long Term Evolution (LTE), Fifth Generation (5G) Specifications, and/or future versions and/or derivatives thereof, units and/or devices which are part of the above networks, and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast

US 12,665,576 B2

3

(DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), Time-Division Multiplexing (TDM), Time-Division Multiple Access (TDMA), Multi-User MIMO (MU-MIMO), General Packet Radio Service (GPRS), extended GPRS (EGPRS), Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated, or group) and/or memory (shared, dedicated, or group), that execute one or more software or firmware programs, a combinational logic circuit, and/or other suitable hardware components that provide the described functionality. In some aspects, some functions associated with the circuitry may be implemented by, one or more software or firmware modules. In some aspects, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

Some demonstrative aspects may be used in conjunction with a WLAN, e.g., a WiFi network. Other aspects may be used in conjunction with any other suitable wireless communication network, for example, a wireless area network, a "piconet", a WPAN, a WVAN and the like.

Some demonstrative aspects may be used in conjunction with a wireless communication network communicating over a frequency band of 2.4 GHz, 5 GHz, and/or 6-7 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a WLAN frequency band, a WPAN frequency band, and the like.

The term "antenna", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

Reference is now made to FIG. 1, which schematically illustrates a block diagram of a system 100, in accordance with some demonstrative aspects.

As shown in FIG. 1, in some demonstrative aspects, system 100 may include a wireless communication network including one or more wireless communication devices, e.g., a wireless communication device 102 and a wireless communication device 140.

In some demonstrative aspects, wireless communication device 102 may include, for example, a UE, an MD, a STA, an AP, a PC, a desktop computer, a mobile computer, a laptop computer, an Ultrabook™ computer, a notebook computer, a tablet computer, a server computer, a handheld computer, an Internet of Things (IoT) device, a Bluetooth (BT) device, a Bluetooth Low Energy (BLE) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a media player, a Smart-phone, a television, a music player, or the like.

In some demonstrative aspects, device 102 may include, operate as, and/or perform the functionality of one or more STAs. For example, device 102 may include at least one STA.

In some demonstrative aspects, device 102 may include, operate as, and/or perform the functionality of one or more WLAN STAs.

In some demonstrative aspects, device 102 may include, operate as, and/or perform the functionality of one or more Wi-Fi STAs.

In one example, a station (STA) may include a logical entity that is a singly addressable instance of a medium access control (MAC) and physical layer (PHY) interface to the wireless medium (WM). The STA may perform any other additional or alternative functionality.

In some demonstrative aspects, device 102 may include a non-AP STA or an access point (AP) STA.

In one example, an AP may include an entity that contains a station (STA), e.g., one STA, and provides access to distribution services, via the wireless medium (WM) for associated STAs. The AP may perform any other additional or alternative functionality.

In one example, a non-AP STA may include a STA that is not contained within an AP. The non-AP STA may perform any other additional or alternative functionality.

In some demonstrative aspects, device 102 may include, operate as, and/or perform the functionality of a BT device.

In some demonstrative aspects, device 102 may include, operate as, and/or perform the functionality of a cellular communication device.

In some demonstrative aspects, device 102 may include, operate as, and/or perform the functionality of, any other device and/or STA.

In some demonstrative aspects, device 102 may include, for example, one or more of a processor 191, an input unit 192, an output unit 193, a memory unit 194, and/or a storage unit 195. Device 102 may optionally include other suitable hardware components and/or software components. In some demonstrative aspects, some or all of the components of device 102 may be enclosed in a common housing or packaging, and may be interconnected or operably associated using one or more wired or wireless links. In other aspects, components of device 102 may be distributed among multiple or separate devices.

In some demonstrative aspects, processor 191 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 executes instructions, for example, of an Operating System (OS) of device 102 and/or of one or more suitable applications.

In some demonstrative aspects, input unit 192 may include, for example, a keyboard, a keypad, a mouse, a touch-screen, a touch-pad, a track-ball, a stylus, a microphone, or other suitable pointing device or input device. Output unit 193 includes, for example, a screen, a touch-screen, a flat panel display, a Light Emitting Diode (LED) display unit, an Organic LED (OLED) display unit, a Liquid Crystal Display (LCD) display unit, a plasma display unit, one or more audio speakers or earphones, or other suitable output devices.

In some demonstrative aspects, memory unit 194 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195 includes, for example, a hard disk drive, a Solid State Drive (SSD), or other suitable removable or non-removable storage units. Memory unit 194 and/or storage unit 195, for example, may store data processed by device 102.

In some demonstrative aspects, wireless communication device 102 may be capable of communicating content, data, information, and/or signals via a wireless medium (WM) 103.

In some demonstrative aspects, wireless medium 103 may include, for example, a radio channel, a wireless communication channel, an RF channel, a WiFi channel, a BT channel, a BLE channel, a cellular channel, a Global Navigation Satellite System (GNSS) Channel, an IR channel, and the like.

In some demonstrative aspects, wireless communication medium 103 may include a 2.4 GHz frequency band, a 5 GHz frequency band, a 6-7 GHz frequency band, a millimeterWave (mmWave) frequency band, e.g., a 60 GHz frequency band, a Sub-1 GHz (S1G) band, and/or any other additional or alternative frequency band.

In some demonstrative aspects, device 102 may include one or more radios including circuitry and/or logic to perform wireless communication between device 102, and one or more other devices. For example, device 102 may include at least one radio 114.

In some demonstrative aspects, radio 114 may include one or more wireless receivers (Rx) including circuitry and/or logic to receive wireless communication signals, RF signals, frames, blocks, transmission streams, packets, messages, data items, and/or data. For example, radio 114 may include at least one receiver 116.

In some demonstrative aspects, radio 114 may include one or more wireless transmitters (Tx) including circuitry and/or logic to transmit wireless communication signals, RF signals, frames, blocks, transmission streams, packets, messages, data items, and/or data. For example, radio 114 may include at least one transmitter 118.

In some demonstrative aspects, radio 114, transmitter 118, and/or receiver 116 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like.

In some demonstrative aspects, radio 114 may be configured to communicate over a 2.4 GHz band, a 5 GHz band, a 6-7 GHz band, an mmWave band, an SIG band, and/or any other band.

In some demonstrative aspects, radio 114 may include, or may be associated with, one or more antennas 107.

In one example, device 102 may include a single antenna 107. In another example, device 102 may include two or more antennas 107.

Antennas 107 may include any type of antennas suitable for transmitting and/or receiving wireless communication signals, blocks, frames, transmission streams, packets, messages and/or data. For example, antennas 107 may include any suitable configuration, structure, and/or arrangement of one or more antenna elements, components, units, assemblies, and/or arrays. In some aspects, antennas 107 may implement transmit and receive functionalities using separate transmit and receive antenna elements. In some aspects, antennas 107 may implement transmit and receive functionalities using common and/or integrated transmit/receive elements.

In some demonstrative aspects, device 102 may include a controller 124 configured to perform and/or to trigger, cause, instruct and/or control device 102 to perform, one or more communications, to generate and/or communicate one or more messages and/or transmissions, and/or to perform one or more functionalities, operations and/or procedures between device 102 and one or more other devices, e.g., as described below.

In some demonstrative aspects, controller 124 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, baseband (BB) circuitry and/or logic, a BB processor, a BB memory, Application Processor (AP) circuitry and/or logic, an AP processor, an AP memory, and/or any other circuitry and/or logic, configured to perform the functionality of controller 124. Additionally or alternatively, one or more functionalities of controller 124 may be implemented by logic, which may be executed by a machine and/or one or more processors, e.g., as described below.

In some demonstrative aspects, at least part of the functionality of controller 124 may be implemented as part of one or more elements of radio 114.

In other aspects, the functionality of controller 124 may be implemented as part of any other element of device 102.

In some demonstrative aspects, device 102 may include a message processor 128 configured to generate, process and/or access one or more messages communicated by device 102.

In one example, message processor 128 may be configured to generate one or more messages to be transmitted by device 102, and/or message processor 128 may be configured to access and/or to process one or more messages received by device 102, e.g., as described below.

In one example, message processor 128 may include at least one first component configured to generate a message, for example, in the form of a frame, field, information element and/or protocol data unit, for example, a MAC Protocol Data Unit (MPDU); at least one second component configured to convert the message into a PHY Protocol Data Unit (PPDU), e.g., a PHY Layer Convergence Procedure (PLCP) PDU, for example, by processing the message generated by the at least one first component, e.g., by encoding the message, modulating the message and/or performing any other additional or alternative processing of the message; and/or at least one third component configured to cause transmission of the message over a wireless communication medium, e.g., over a wireless communication channel in a wireless communication frequency band, for example, by applying to one or more fields of the PPDU one or more transmit waveforms. In other aspects, message processor 128 may be configured to perform any other additional or alternative functionality and/or may include any other additional or alternative components to generate and/or process a message to be transmitted.

In some demonstrative aspects, message processor 128 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, BB circuitry and/or logic, a BB processor, a BB memory, AP circuitry and/or logic, an AP processor, an AP memory, and/or any other circuitry and/or logic, configured to perform the functionality of message processor 128, respectively. Additionally or alternatively, one or more functionalities of message processor 128 may be implemented by logic, which may be executed by a machine and/or one or more processors, e.g., as described below.

In some demonstrative aspects, at least part of the functionality of message processor 128 may be implemented as part of radio 114.

In some demonstrative aspects, at least part of the functionality of message processor 128 may be implemented as part of controller 124.

In other aspects, the functionality of message processor 128 may be implemented as part of any other element of device 102.

In some demonstrative aspects, at least part of the functionality of controller 124 and/or message processor 128 may be implemented by an integrated circuit, for example, a chip, e.g., a System on Chip (SoC). In one example, the chip or SoC may be configured to perform one or more functionalities of radio 114. For example, the chip or SoC may include one or more elements of controller 124, one or more elements of message processor 128, and/or one or more elements of radio 114. In one example, controller 124, message processor 128, and radio 114 may be implemented as part of the chip or SoC.

In other aspects, controller 124, message processor 128 and/or radio 114 may be implemented by one or more additional or alternative elements of device 102.

In some demonstrative aspects, device 102 may include, operate as, perform the role of, and/or perform one or more functionalities of, one or more STAs.

In some demonstrative aspects, device 102 may form, or may communicate as part of, a wireless local area network (WLAN).

In some demonstrative aspects, device 102 may form, or may communicate as part of, a WiFi network.

In other aspects, device 102 may form, and/or communicate as part of, any other additional or alternative network.

In some demonstrative aspects, device 102 may include a phase shifter 120 configured to generate phase-shifted signals, e.g., as described below.

In some demonstrative aspects, phase shifter 120 may be implemented as part of radio 114, e.g., as described below.

In some demonstrative aspects, phase shifter 120 may be implemented as part of transmitter 118, e.g., as described below.

In other aspects, phase shifter 120 may be implemented as part of any other component, element, and/or block of device 102.

In some demonstrative aspects, phase shifter 120 may be configured to receive an input clock signal 111 having an input frequency and an input phase, e.g., as described below.

In some demonstrative aspects, phase shifter 120 may include an input 113 configured to receive the input clock signal 111, e.g., as described below.

In some demonstrative aspects, phase shifter 120 may be configured to generate a first signal 115 and a second signal 117, for example, based on the input clock signal 111, e.g., as described below.

In some demonstrative aspects, the first signal 115 and the second signal 117 may have the input frequency of input clock signal 111, e.g., as described below.

In some demonstrative aspects, a phase of the first signal 115 may be based on the input phase of the input clock signal 111, e.g., as described below.

In some demonstrative aspects, a phase of the second signal 117 may be shifted by a phase-shift relative to the phase of the first signal 115, e.g., as described below.

In some demonstrative aspects, phase shifter 120 may include an output 119 configured to provide an output 121, for example, based on the first signal 115 and the second signal 117, e.g., as described below.

In some demonstrative aspects, phase shifter 120 may be configured to generate the first signal 115 and the second signal 117, for any frequency in a wide range of input frequencies of input signal 111, e.g., as described below.

In some demonstrative aspects, phase shifter 120 may be configured to generate the first signal 115 and the second signal 117, for example, even for substantially any input frequency of input signal 111, e.g., as described below.

In some demonstrative aspects, phase shifter 120 may be configured to generate the phase-shift in a wide range of degrees, e.g., as described below.

In some demonstrative aspects, phase shifter 120 may be configured to generate the phase-shift in a wide range of degrees, for example, for any input frequency in a wide range of input frequencies, e.g., as described below.

In some demonstrative aspects, phase shifter 120 may be configured to generate the phase-shift in the wide range of degrees, for example, for any input frequency, e.g., as described below.

In some demonstrative aspects, the phase shifter 120 may be implemented as part of transmitter 118, e.g., as described below.

In some demonstrative aspects, transmitter 118 may be configured to transmit an RF transmit signal 127, for example, based on the first signal 115 and the second signal 117, e.g., as described below.

In some demonstrative aspects, the RF transmit signal 127 may be transmitted by transmitter 118 via the one or more antennas.

In some demonstrative aspects, the input clock signal 111 may include a Local Oscillator (LO) signal 131, e.g., as described below.

In some demonstrative aspects, device 102 may include an LO generator 130 to generate the LO signal 131, e.g., as described below.

In some demonstrative aspects, the input clock signal 111 may include a modulated clock signal, e.g., as described below.

In some demonstrative aspects, the input clock signal 111 may include a Modulated Local Oscillator (MOLO) signal 133, e.g., as described below.

In some demonstrative aspects, device 102 may include a Digital Time Converter (DTC) 132 configured to generate the MOLO signal 133, for example, by modulating a phase of the LO signal 131, e.g., as described below.

In some demonstrative aspects, phase shifter 120 may be configured to provide a technical solution to support generating, e.g., in an efficient way, a 90° phase shift, e.g., relative to an instantaneous frequency, of a MOLO signal, for example, while utilizing a single DTC, for example, even without a need of an additional DTC, e.g., a full-blown-DTC.

In one example, phase shifter 120 may be configured to generate a 90° phase shift between the first signal 115 and the second signal 117, e.g., based on the MOLO signal 133. For example, phase shifter 120 may be configured to efficiently generate the 90° phase shift between the first signal 115 and the second signal 117, e.g., based on the MOLO signal 133, for example, in a way which may provide a technical solution utilizing only one DTC, e.g., DTC 132.

In some demonstrative aspects, phase shifter 120 may be implemented to provide a technical solution to generate a phase shift, for example, for non-modulated clocks, e.g., for a non-modulated LO signal 131.

For example, phase shifter 120 may be implemented to provide a technical solution to support an efficient way of generating In-Phase and Quadrature (I&Q) components, e.g., for Rx mixing, and/or for a carrier shift.

In some demonstrative aspects, phase shifter 120 may be implemented to provide a technical solution to support generating, e.g., in an efficient way, a 90° phase shift, for example, by manipulating a MOLO signal, e.g., using a precise digital-RFIC. For example, phase shifter 120 may be implemented to provide a technical solution to support generating new edges between a rise and a fall of the MOLO signal, for example, to generate an instantaneous 90° shift, e.g., relative to each MOLO-cycle of the MOLO signal, e.g., as described below.

In some demonstrative aspects, phase shifter 120 may be implemented to provide a technical solution to support generating a phase shift, for example, without requiring more than one DTC, e.g., using a single DTC, without requiring a polyphase filter, and/or without requiring a divider after a DTC, e.g., as described below.

In some demonstrative aspects, phase shifter 120 may include a quadrature phase-shift generator 110 configured to generate the first signal 115 and the second signal 117, for example, based on the input clock signal 111, e.g., as described below.

In some demonstrative aspects, quadrature phase-shift generator 110 may be configured to generate the first signal 115 and the second signal 117, for example, such that a phase of the second signal 117 may be shifted by a quadrature phase-shift relative to the phase of the first signal 115, e.g., as described below.

In some demonstrative aspects, quadrature phase-shift generator 110 may be operable to generate the quadrature phase-shift between signals 115 and 117, for example, in relatively wide range of phase shift degrees, e.g., as described below.

In some demonstrative aspects, quadrature phase-shift generator 110 may be operable to generate the quadrature phase-shift between signals 115 and 117, for example, in a range of 89-91 degrees, for example, for any input frequency in at least a frequency range, which may be based on a frequency value, denoted F, e.g., as described below.

In some demonstrative aspects, quadrature phase-shift generator 110 may be operable to generate the quadrature phase-shift, for example, in the range of 89-91 degrees, for example, for any input frequency in at least a frequency range between 0.95*F and 1.05*F, e.g., as described below.

In some demonstrative aspects, the frequency value F may be at least 1 Gigahertz (GHz), e.g., as described below.

In some demonstrative aspects, the frequency value F may be at least 2.5 GHz, e.g., as described below.

In other aspects, any other frequency value F, e.g., greater than 1 Ghz or lower than 1 GHz, may be implemented.

In some demonstrative aspects, quadrature phase-shift generator 110 may be operable to generate the quadrature phase-shift, for example, in the range of 89-91 degrees, for example, for substantially any input frequency in at least a frequency range between 0.9*F and 1.1*F, e.g., as described below.

In some demonstrative aspects, quadrature phase-shift generator 110 may be operable to generate the quadrature phase-shift for example, in the range of 89-91 degrees, for example, for substantially any input frequency in at least a frequency range between 0.5*F and 1.5*F, e.g., as described below.

In some demonstrative aspects, quadrature phase-shift generator 110 may be operable to generate the quadrature phase-shift, for example, in a range of 89.5-90.5 degrees, for example, for substantially any input frequency in at least the frequency range between 0.95*F and 1.05*F, e.g., as described below.

In some demonstrative aspects, quadrature phase-shift generator 110 may be operable to generate the quadrature phase-shift, for example, in a range of 89.9-90.1 degrees, for example, for substantially any input frequency in at least the frequency range between 0.95*F and 1.05*F, e.g., as described below.

In some demonstrative aspects, quadrature phase-shift generator 110 may be operable to generate the quadrature phase-shift, for example, in the range of 89-91 degrees, for example, for substantially any input frequency, e.g., as described below.

In other aspects, quadrature phase-shift generator 110 may be operable to generate the quadrature phase-shift, for example, in any other range of degrees and/or for any other range of input frequency.

In some demonstrative aspects, quadrature phase-shift generator 110 may be operable to generate a first pair of signals, e.g., including the first signal 115 and the second signal 117, having the quadrature phase-shift in the range of 89-91 degrees, for example, based on a first input clock signal 111 having a first input frequency, e.g., as described below.

In some demonstrative aspects, quadrature phase-shift generator 110 may be operable to generate a second pair of signals, e.g., different from the first pair of signals, having the quadrature phase-shift in the range of 89-91 degrees, for example, based on a second input clock signal 111 having a second input frequency, e.g., as described below.

In some demonstrative aspects, the second input frequency may be different from the first input frequency, e.g., as described below.

In some demonstrative aspects, the second input frequency may be at least 1.1 times greater than the first input frequency.

In some demonstrative aspects, the second input frequency may be at least 1.5 times greater than the first input frequency.

In other aspects, any other first and second input frequencies may be implemented.

In some demonstrative aspects, quadrature phase-shift generator 110 may include an inverter (INV) 122 to generate an inverted clock signal 123, for example, based on the input clock signal 111, e.g., as described below.

In some demonstrative aspects, a phase of the inverted clock signal 123 may be shifted, for example, by 180 degrees, relative to the input phase of the input clock signal 111, e.g., as described below.

In some demonstrative aspects, quadrature phase-shift generator 110 may include a delayer 126 to provide a delayed clock signal 129, for example, by applying a predefined delay to the input clock signal 111, e.g., as described below.

In some demonstrative aspects, quadrature phase-shift generator 110 may include an interpolator 136 to generate the second signal 117, for example, based on an interpolation of the delayed clock signal 129 and the inverted clock signal 123, e.g., as described below.

In some demonstrative aspects, interpolator 136 may include an edge interpolator, which may be configured to generate the second signal 117, for example, based on an edge interpolation of edges of the delayed clock signal 129 and edges of the inverted clock signal 123, e.g., as described below.

In some demonstrative aspects, interpolator 136 may include a 50% interpolator, which may be configured to interpolate 50% of an edge of the delayed clock signal 129 and 50% of an edge of the inverted clock signal 123, e.g., as described below.

In other aspects, interpolator 136 may include any other suitable type of interpolator.

In some demonstrative aspects, the predefined delay applied by the delayer 126 may be based on a chip period, denoted Tc, of the input clock signal 111, e.g., as described below.

In some demonstrative aspects, for example, the first signal 115 and the second signal 117 may be delayed by a delay time relative to the input clock signal 111. For example, the delay time may be based on the chip period Tc, e.g., as described below.

In some demonstrative aspects, for example, according to a first phase-shifter implementation scheme, delayer 126 may include a first delayer and a second delayer, e.g., as described below with reference to FIG. 2.

In some demonstrative aspects, the first delayer may be configured to provide the first signal 115, for example, by applying half of the predefined delay to the input clock signal 111, e.g., as described below.

In some demonstrative aspects, the second delayer may be configured to provide the delayed clock signal 129, for example, by applying half of the predefined delay to the first signal 115, e.g., as described below.

In some demonstrative aspects, for example, according to the first phase-shifter implementation scheme, the predefined delay applied by delayer 126 may be equal to half of the chip period Tc, for example, predefined delay=Tc/2, e.g., as described below.

In some demonstrative aspects, for example, according to the first phase-shifter implementation scheme, the first signal 115 and the second signal 117 may be delayed, for example, by quarter of the chip period Tc, e.g., Tc/4, relative to the input clock signal 111, e.g., as described below.

In some demonstrative aspects, for example, according to a second phase-shifter implementation scheme, interpolator 136 may include a first interpolator and a second interpolator, e.g., as described below.

In some demonstrative aspects, the first interpolator may be configured to provide the first signal 115, for example, based on an interpolation of the input clock signal 111 and the delayed clock signal 129, e.g., as described below.

In some demonstrative aspects, the second interpolator may be configured to provide the second signal 117, for example, based on an interpolation of the delayed clock signal 129 and the inverted clock signal 123, e.g., as described below.

In some demonstrative aspects, for example, according to the second phase-shifter implementation scheme, the predefined delay applied by delayer 126 may be equal to a quarter of the chip period Tc, for example, predefined delay=Tc/4, e.g., as described below.

In some demonstrative aspects, for example, according to the second phase-shifter implementation scheme, the first signal 115 and the second signal 117 may be delayed, for example, by an eighth of the chip period Tc, e.g., Tc/8, relative to the input clock signal 111, e.g., as described below.

Figure 2:
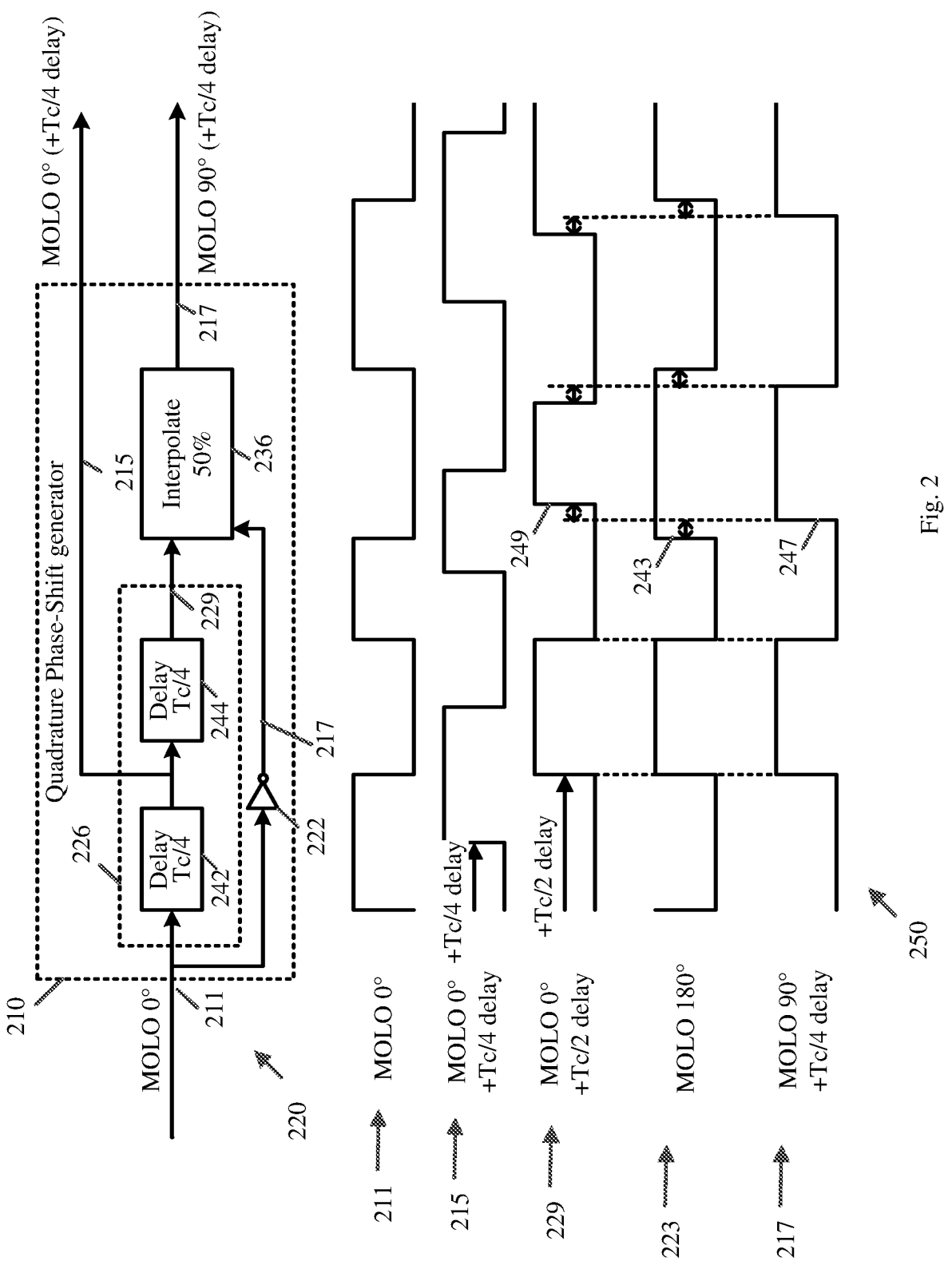
FIG. 2 is a schematic illustration of a phase shifter and a plurality of signals processed by the phase shifter, in accordance with some demonstrative aspects.

Reference is made to FIG. 2, which schematically illustrates a phase shifter 220 and a plurality of signals 250 processed by the phase shifter 220, in accordance with some demonstrative aspect. For example, phase shifter 120 (FIG. 1) may include one or more elements of phase shifter 220 and/or may perform one or more operations and/or functionalities of phase shifter 220.

In some demonstrative aspects, phase shifter 220 may be implemented, for example, according to the first phase-shifter implementation scheme, e.g., as described below.

In some demonstrative aspects, as shown in FIG. 2, phase shifter 220 may include a quadrature phase-shift generator 210. For example, quadrature phase-shift generator 110 (FIG. 1) may include one or more elements of quadrature phase-shift generator 210 and/or may perform one or more operations and/or functionalities of quadrature phase-shift generator 210.

In some demonstrative aspects, as shown in FIG. 2, quadrature phase-shift generator 210 may be configured to generate a first signal 215 and a second signal 217, for example, based on an input clock signal 211.

In some demonstrative aspects, as shown in FIG. 2, input clock signal 211 may include a MOLO signal, for example, a MOLO 0° input signal.

In some demonstrative aspects, as shown in FIG. 2, quadrature phase-shift generator 210 may be configured to generate the first signal 215 and the second signal 217, for example, such that a phase of the second signal 217 may be shifted by 90 degrees relative to the phase of the first signal 215, e.g., as described below.

In some demonstrative aspects, as shown in FIG. 2, quadrature phase-shift generator 210 may include an inverter 222 configured to generate an inverted clock signal 223, e.g., a MOLO 180° inverted signal, for example, based on the input clock signal 211.

In some demonstrative aspects, inverter 222 may invert the input clock signal 211, e.g., using a simple inversion, for example, to create the MOLO 180° inverted signal, e.g., inverted clock signal 223.

In some demonstrative aspects, as shown in FIG. 2, quadrature phase-shift generator 210 may include a delayer 226 to provide a delayed clock signal 229, e.g., a MOLO 0° signal with a delay of TC/2, for example, by applying a predefined delay, e.g., a delay of TC/2, to the input clock signal 211.

In some demonstrative aspects, as shown in FIG. 2, quadrature phase-shift generator 210 may include a first delayer 242 and a second delayer 244, e.g., as described below.

In some demonstrative aspects, the first delayer 242 may be configured to provide the first signal 215, for example, by applying a Tc/4 delay to the input clock signal 211. For example, the first delayer 242 may be configured to provide the first signal 215 including a MOLO 0° signal with a TC/4 delay.

In some demonstrative aspects, the second delayer 244 may be configured to provide the delayed clock signal 229, e.g., having the delay of Tc/2, for example, by applying another Tc/4 delay to the first signal 215. For example, the second delayer 244 may be configured to provide the delayed clock signal 229 including a MOLO 90° signal with a TC/2 delay.

In some demonstrative aspects, as shown in FIG. 2, quadrature phase-shift generator 210 may include an interpolator 236 to generate the second signal 217, for example, based on an interpolation of the delayed clock signal 229 and the inverted clock signal 223.

In some demonstrative aspects, as shown in FIG. 2, interpolator 236 may include an edge interpolator configured to generate the second signal 217, for example, based on an edge interpolation of edges of the delayed clock signal 229 and edges of the inverted clock signal 223.

In some demonstrative aspects, as shown in FIG. 2, interpolator 236 may include a 50% interpolator to interpolate 50% of an edge, e.g., each edge, of the delayed clock signal 229, with 50% of a respective edge, e.g., each edge, of the inverted clock signal 223, for example, to create an edge, e.g., each respective edge, of the second signal 217.

In some demonstrative aspects, as shown in FIG. 2, interpolator 236 may interpolate 50% of an edge 249 of the delayed clock signal 229 with 50% of an edge 243 of the inverted clock signal 223, for example, to create an edge 247 of the second signal 217.

In some demonstrative aspects, as shown in FIG. 2, the first signal 215 and the second signal 217 may be delayed, for example, by Tc/4, relative to the input clock signal 211.

In some demonstrative aspects, interpolator 236 may be configured to interpolate between an edge of signal 223, e.g., edge 243, and a following edge of signal 229, e.g., edge 249, for example, to provide a 90° phase shift between signals 215 and 217.

For example, a mid-point between the MOLO 0° signal, e.g., input clock signal 211, and the MOLO 180° signal, e.g., inverted clock signal 223, may be used to produce a desired 90° signal, e.g., second signal 217.

In some demonstrative aspects, quadrature phase-shift generator 210 may be configured to bring edges of signals 223 and 229, e.g., edges 249 and 243, closer to each other, for example, to support valid interpolation by interpolator 236.

For example, there may be a nominal distance of about Tc/2 between the edges of signals 223 and 229. This nominal distance may be long.

In some demonstrative aspects, quadrature phase-shift generator 210 may be configured to bring the edges of signals 223 and 229 closer to each other, for example, by delaying the MOLO 0° signal, e.g., the input clock signal 211, for example, by Tc/2, e.g., to generate the delayed clock signal 229.

In some demonstrative aspects, as shown in FIG. 2, the second signal 217, e.g., post interpolation by interpolator 236, may have half of the total delay of the interpolated signals 223 and 229. For example, the first signal 215, e.g., the MOLO 0° output signal with the Tc/4 delay, may be further delayed, e.g., by the second delayer 244. For example, as shown in FIG. 2, the second delayer 244 may configured to apply the additional delay of Tc/4 to the first signal 215. Accordingly, the delayed signal 229 may have a delay of Tc/2, which may result in the second signal 217 having the delay of Tc/4.

In some demonstrative aspects, as shown in FIG. 2, a distance between interpolated edges of signals 223 and 229, e.g., the distance between edges 243 and 249, may be based, for example, on an instantaneous frequency of the input clock signal 211. For example, the distance between the interpolated edges of signals 223 and 229, e.g., the distance between edges 243 and 249, may vary, for example, according to a modulation over the input frequency of the input clock signal 211.

In some demonstrative aspects, quadrature phase-shift generator 210 may be configured to provide a technical solution to support a relatively wide range of modulation, for example, even without exceeding a valid-interpolation range. For example, this relative wide range of modulation may be achieved, for example, by maintaining a pre-modulated distance of about −0 between the interpolated edges of signal 243 and 249 is. For example, this relative wide range of modulation may provide a technical solution, which may be important, for example, for Error Vector Magnitude (EVM) performance, e.g., in wide BWs.

In some demonstrative aspects, inverter 222 may be configured to invert the input clock signal 211, for example, by simply flipping between negative-positive (n-p) nodes, for example, for differential signals. For example, this inversion may provide a technical solution to prevent an additional delay on a bottom branch of phase shifter 220, and/or to avoid a need to align an upper branch of phase shifter 220.

In some demonstrative aspects, an interpolation self-delay of interpolator 236 may be accounted, for example, by adding a "dummy interpolator", e.g., dummy multiplexers (MUXs), on a path of the MOLO 0° signal, e.g., on the path of the first signal 215.

Figure 3:
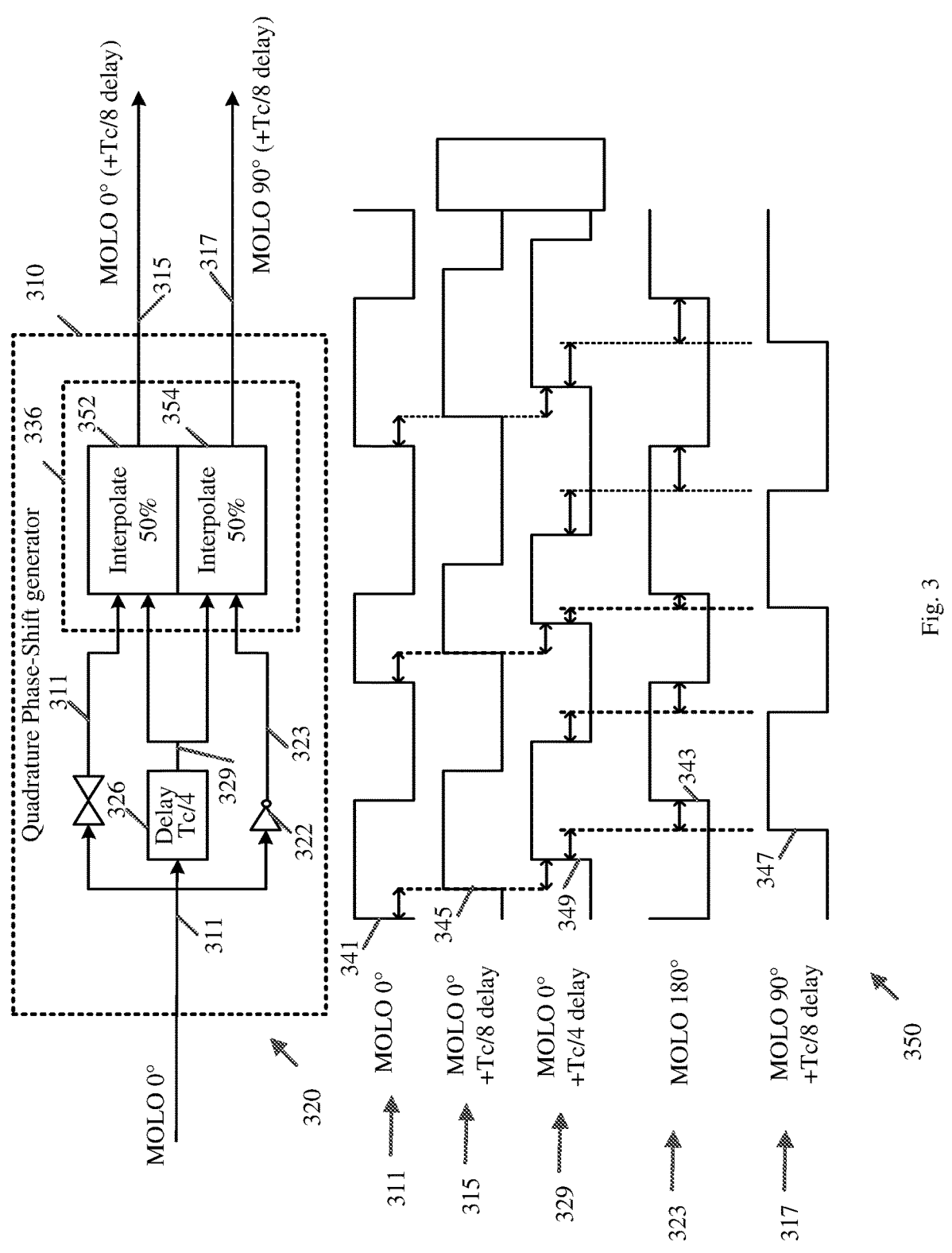
FIG. 3 is a schematic illustration of a phase shifter and a plurality of signals processed by the phase shifter, in accordance with some demonstrative aspects.

Reference is made to FIG. 3, which schematically illustrates a phase shifter 320 and a plurality of signals 350 processed by the phase shifter 320, in accordance with some demonstrative aspects. For example, phase shifter 120 (FIG. 1) may include one or more elements of phase shifter 320 and/or may perform one or more operations and/or functionalities of phase shifter 320.

In some demonstrative aspects, phase shifter 320 may be implemented, for example, according to the second phase-shifter implementation scheme, e.g., as described below.

In some demonstrative aspects, as shown in FIG. 3, phase shifter 320 may include a quadrature phase-shift generator 310. For example, quadrature phase-shift generator 110 (FIG. 1) may include one or more elements of quadrature phase-shift generator 310 and/or may perform one or more operations and/or functionalities of quadrature phase-shift generator 310.

In some demonstrative aspects, as shown in FIG. 3, quadrature phase-shift generator 310 may be configured to generate a first signal 315 and a second signal 317, for example, based on an input clock signal 311, e.g., as described below.

In some demonstrative aspects, as shown in FIG. 3, input clock signal 311 may include a MOLO signal, for example, a MOLO 0° input signal.

In some demonstrative aspects, as shown in FIG. 3, quadrature phase-shift generator 310 may be configured to generate the first signal 315 and the second signal 317, for example, such that a phase of the second signal 317 may be shifted by 90 degrees relative to the phase of the first signal 315, e.g., as described below.

In some demonstrative aspects, as shown in FIG. 3, quadrature phase-shift generator 310 may include an inverter 322 configured to generate an inverted clock signal 323, e.g., a MOLO 180° inverted signal, for example, based on the input clock signal 311.

In some demonstrative aspects, as shown in FIG. 3, quadrature phase-shift generator 310 may include a delayer 326 to provide a delayed clock signal 329, e.g., a MOLO 0° signal with a delay of TC/4, for example, by applying a predefined delay, e.g., a delay of TC/4, to the input clock signal 311.

In some demonstrative aspects, as shown in FIG. 3, quadrature phase-shift generator 310 may include an interpolator 336 to generate the second signal 317, for example, based on the delayed clock signal 329, the inverted clock signal 323, and the input clock signal 311.

In some demonstrative aspects, as shown in FIG. 3, quadrature phase-shift generator 310 may include a first interpolator 352 and a second interpolator 354.

In some demonstrative aspects, as shown in FIG. 3, the first interpolator 352 may be configured to provide the first signal 315, for example, based on an interpolation of the input clock signal 311 and the delayed clock signal 329.

In some demonstrative aspects, as shown in FIG. 3, first interpolator 352 may include a 50% interpolator to interpolate 50% of an edge, e.g., each edge, of the delayed clock signal 329, with 50% of a respective edge, e.g., each edge, of the input clock signal 311, for example, to create an edge, e.g., each respective edge, of the first signal 315.

In some demonstrative aspects, as shown in FIG. 3, first interpolator 352 may be configured to interpolate 50% of an edge 349 of the delayed clock signal 329, with 50% of an edge 341 of the input clock signal 311, for example, to create an edge 345 of the first signal 315.

In some demonstrative aspects, as shown in FIG. 3, the second interpolator 354 may be configured to provide the second signal 317, for example, based on an interpolation of the delayed clock signal 329 and the inverted clock signal 323.

In some demonstrative aspects, as shown in FIG. 3, second interpolator 354 may include a 50% interpolator to interpolate 50% of an edge, e.g., each edge, of the delayed clock signal 329, with 50% of a respective edge, e.g., each edge, of the inverted clock signal 323, for example, to create an edge, e.g., each respective edge, of the second signal 317.

In some demonstrative aspects, as shown in FIG. 3, second interpolator 354 may be configured to interpolate 50% of the edge 349 of the delayed clock signal 329 and 50% of an edge 343 of the inverted clock signal 323, for example, to create an edge 347 of the second signal 317.

In some demonstrative aspects, as shown in FIG. 3, delayer 326 may be configured to apply a total delay of a quarter of the chip period Tc, e.g., predefined delay=Tc/4.

In some demonstrative aspects, as shown in FIG. 3, the first signal 315 and the second signal 317 may be delayed, for example, by an eighth of the chip period Tc, e.g., Tc/8, relative to the input clock signal 311.

In some demonstrative aspects, as shown in FIG. 3, quadrature phase-shift generator 310 may be configured to provide a technical solution utilizing a single delay element, e.g., delayer 326. For example, the use of a single delay element, e.g., delayer 326, may provide a technical solution to mitigate a risk of mismatch. In some cases, this technical solution may require a larger interpolation range, which may require utilizing an additional interpolator, e.g., using the two interpolators 354 and 352.

In some demonstrative aspects, as shown in FIG. 3, interpolator 354 may be utilized to generate the second signal 317, for example, similar to interpolator 236 (FIG. 2), which may be utilized to generate the second signal 217 (FIG. 2).

In some demonstrative aspects, as shown in FIG. 3, quadrature phase-shift generator 310 may utilize an additional interpolator, e.g., interpolator 352, for example, to generate the first signal 315.

In some demonstrative aspects, as shown in FIG. 3, the additional interpolator, e.g., interpolator 352, may be configured to produce the first signal 315 as a delayed version of the MOLO 0° input signal.

In some demonstrative aspects, as shown in FIG. 3, delayer 326 may be configured to apply the delay of TC/4, which may be smaller, e.g., compared to the delay of Tc/2 applied by delayer 226 (FIG. 2). For example, the delayed signal may be configured for use by both interpolator 352 and interpolator 354.

In some demonstrative aspects, as shown in FIG. 3, a branch of the 0° signals and a branch of the 90° signals may be implemented as symmetric branches. Accordingly, phase shifter 320 may be configured to provide a technical solution, which may not require calibration and/or matching delay-cells.

In some demonstrative aspects, phase shifter 320 may be configured to provide a technical solution to support an efficient way of generating IQ components, for example, in non-modulated clocks, e.g., for mixers, Loop-Back (LPBK) components, and/or the like.

Referring back to FIG. 1, in some demonstrative aspects, transmitter 118 may be configured according to a poly-phase combining mechanism, for example, which may be configured to suppress harmonics of the RF transmit signal 127, e.g., when implemented as a wideband RF Tx signal.

In some demonstrative aspects, transmitter 118 may be configured to generate wideband RF Tx signals according to an RF Tx signal generation mechanism, which may be configured to suppress one or more harmonics of the wideband RF Tx signals, e.g., as described below.

In some demonstrative aspects, for example, in some use cases, implementations, deployments, and/or scenarios, there may be a need to address a technical issue of elevated signal harmonics in wideband RF Tx signals, e.g., as described below.

For example, a non-linear nature of Tx chains in wireless radios, e.g., analog Tx chains and/or digital Tx chains, may result in elevated signal harmonics.

For example, spectral energy of these elevated harmonics may create regulatory challenges.

For example, in some use cases, implementations, deployments and/or scenarios, there may be one or more technical issues and/or disadvantages to implement post Tx power amplifier filtering to suppress the harmonics.

For example, the post Tx power amplifier filtering may utilize external or on-chip filters to suppress the harmonics, e.g., after a Tx power amplifier of the transmitter.

For example, implementing the post Tx power amplifier filtering to suppress the harmonics may increase cost, increase chip area, and/or may reduce power efficiency.

For example, implementation of the post Tx power amplifier filtering to suppress the harmonics may be limited to narrow-band operation, e.g., over relatively narrow channels.

In one example, the post Tx power amplifier filtering may have an impact on a required signal insertion loss. Accordingly, the post Tx power amplifier filtering may have an impact on system efficiency and/or system power consumption.

In another example, in some cases, the post Tx power amplifier filtering may not be effective. For example, a filtering post chip may be too late, and an impact of the harmonics through coupling on-chip mechanisms may impact and limit performance, This technical problem may occur, for example, in implementations utilizing simultaneous radio operation, e.g., WiFi Tx with BT Rx, from a same chip and loop back calibration receiver.

In some demonstrative aspects, in some use cases, implementations, deployments and/or scenarios, there may be one or more technical issues and/or disadvantages to implement a time-shift delay, e.g., instead of a phase-shift, for example, to suppress the harmonics.

In one example, the time-shift delay may result in EVM degradation, and/or reduced suppression of the harmonics.

In some demonstrative aspects, in some use cases, implementations, deployments and/or scenarios, there may be one or more technical issues and/or disadvantages to implement a plurality of DTCs, for example, to generate a shifted MOLO separately, for example, to suppress the harmonics.

In one example, implementing the plurality of DTCs may increase cost, may increase chip area, and/or may reduce power efficiency.

In some demonstrative aspects, transmitter 118 may be configured to generate the wideband RF Tx signals according to an RF Tx signal generation mechanism, which may be configured to suppress one or more harmonics of the wideband RF Tx signals, for example, based on phase-shifted "versions" of a modulated signal, e.g., as described below.

In some demonstrative aspects, the phase shifted "versions" of the modulated signal may be combined, for example, in order to suppress one or more harmonics, e.g., odd harmonics, of a wideband RF Tx signal, e.g., as described below.

In some demonstrative aspects, transmitter 118 may be configured to generate the wideband RF Tx signals according to an RF Tx signal generation mechanism, which may be configured to provide a technical solution to suppress one or more harmonics, as described below.

In some demonstrative aspects, transmitter 118 may be configured to generate the wideband RF Tx signals according to an RF Tx signal generation mechanism, which may be configured to provide a technical solution to support the use of digital-polar-Tx techniques, for example, even without adding an external filter and/or even without violating Tx masks. For example, the digital-polar-Tx techniques may be more efficient than IQ Tx techniques.

In some demonstrative aspects, transmitter 118 may be configured to generate the wideband RF Tx signals according to an RF Tx signal generation mechanism, which may be configured to provide a technical solution to support a wideband suppression of harmonics, e.g., odd harmonics. For example, the wideband suppression of harmonics may be designed to be independent of a carrier frequency.

In some demonstrative aspects, transmitter 118 may be configured to generate the wideband RF Tx signals according to an RF Tx signal generation mechanism, which may be configured to provide a technical solution to support selective wideband suppression of harmonics, e.g., odd harmonics. For example, the selective wideband suppression of harmonics may be selectively "turned" on or off, e.g., depending on a situation, for example, to recover an efficiency impact.

In some demonstrative aspects, transmitter 118 may be configured to suppress the harmonics, for example, by combining two or more shifted versions, e.g., three or more shifted versions, of a modulated signal.

In some demonstrative aspects, phase shifter 102 may be configured to provide a technical solution to achieve maximal harmonic suppression and/or minimal EVM degradation, for example, by performing a proper phase shift, e.g., relative to an instantaneous frequency, for example, instead of applying a constant delay. For example, the technical solution provided by the phase shift may be more pronounced in higher bandwidths, e.g., 1 GHz and above.

In some demonstrative aspects, transmitter 118 may be configured to utilize a 450 shifted version of the modulated signal, and 90° shifted version of the modulated signal 133. For example, the 45° shifted version may be generated, for example, by interpolating a MOLO (0°) input signal with a 90° shifted version of the MOLO input signal 133.

In other aspects, transmitter 118 may be configured to utilize any other additional and/or alternative shifted versions of the modulated signal 133.

In some demonstrative aspects, phase shifter 120 may be configured to provide a phase-offset technique, for example, as described above.

In some demonstrative aspects, the phase-offset technique may be implemented, for example, to provide a technical solution to generate the RF transmit signal 127 with an improved level of harmonic suppression.

In some demonstrative aspects, the phase-offset technique may be implemented to provide a technical solution to generate the RF transmit signal 127 with an improved EVM, for example, with no EVM degradation, or with reduced EVM degradation.

In some demonstrative aspects, the phase-offset technique may be implemented to provide a technical solution to generate the RF transmit signal 127, for example, in a manner which may be independent of the carrier frequency. Accordingly, the phase-offset technique may be implemented to provide a technical solution to generate the RF transmit signal 127, for example, while avoiding changes and/or adjustments, e.g., when changing carrier frequencies.

Figure 4:
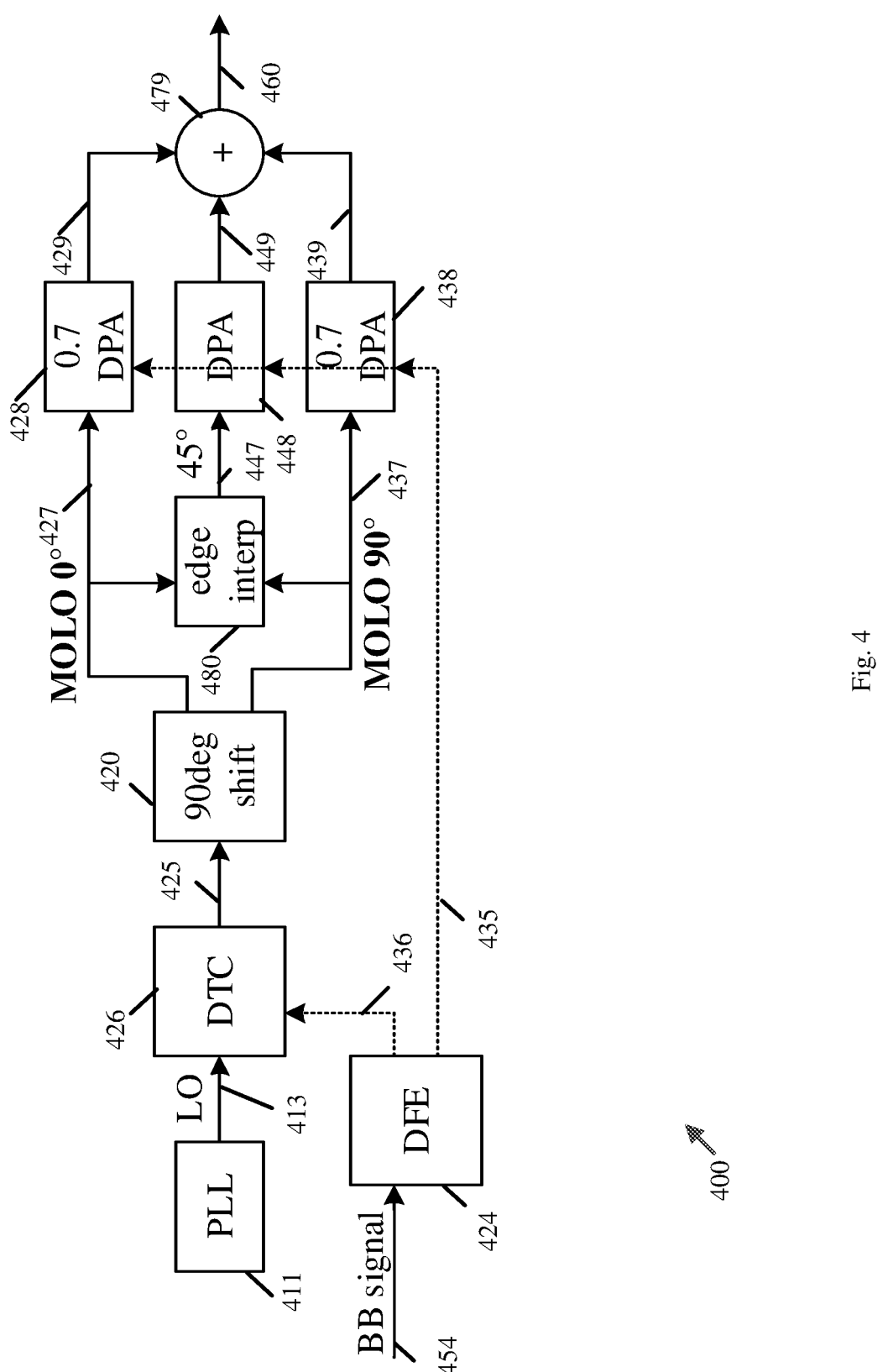
FIG. 4 is a schematic illustration of a Radio Frequency (RF) Transmit (Tx) signal generator implementing a phase shifter, in accordance with some demonstrative aspects.

Reference is made to FIG. 4, which schematically illustrates an RF Tx signal generator 400, in accordance with some demonstrative aspects.

In some demonstrative aspects, RF Tx signal generator 400 may be configured to generate an RF Tx signal 460 based on a baseband signal 454, e.g., as described below.

In some demonstrative aspects, RF Tx signal generator 400 may include a DTC 426 configured to generate a MOLO signal 425 by modulating a phase of an LO signal 413, e.g., from a Phase-Locked-Loop (PLL) 411.

In some demonstrative aspects, RF Tx signal generator 400 may include a Digital Front End (DFE) 424, which may be configured to control generation of the MOLO signal 425 by the DTC 426, for example, based on the baseband signal 454.

In some demonstrative aspects, for example, DFE 424 may be configured to generate one or more control signals

436 to control DTC 426, for example, to generate the MOLO signal 425, e.g., based on the baseband signal 454.

In some demonstrative aspects, RF Tx signal generator 400 may include a phase shifter 420 configured to generate a first MOLO signal 427 and a second MOLO signal 437, for example, based on the MOLO signal 425, e.g., as described below. For example, phase shifter 420 (FIG. 1) may include one or more elements of phase shifter 120 (FIG. 1), and/or may perform one or more operations and/or functionalities of phase shifter 120 (FIG. 1).

In some demonstrative aspects, phase shifter 420 may be configured to generate the MOLO signal 437 having a predefined phase shift relative to the MOLO signal 427, e.g., as described below.

In some demonstrative aspects, phase shifter 420 may be configured to generate the MOLO signal 437 having a phase shift of about 90 degrees relative to the MOLO signal 427.

In other aspects, phase shifter 420 may be configured to generate the MOLO signal 437 having any other predefined phase shift relative to the MOLO signal 427.

In some demonstrative aspects, RF Tx signal generator 400 may be configured to generate a third MOLO signal 447, for example, based on MOLO signals 427 and 437, e.g., as described below.

In some demonstrative aspects, RF Tx signal generator 400 may include an interpolator 480 configured to generate the MOLO signal 447 including an interpolated MOLO signal 447, for example, based on an interpolation of MOLO signals 427 and 437.

In some demonstrative aspects, interpolator 480 may include an edge interpolator configured to generate MOLO signal 447 based, for example, on an edge interpolation of the MOLO signal 427 and the MOLO signal 437.

In some demonstrative aspects, RF Tx signal generator 400 may include one or more Digital Power Amplifiers (DPAs) to generate a first wideband RF signal 429, for example, by modulating an amplitude of the first MOLO signal 427; to generate a second wideband RF signal 439, for example, by modulating an amplitude of the second MOLO signal 437; and/or to generate a third wideband RF signal 449, for example, by modulating an amplitude of the interpolated MOLO signal 447.

In some demonstrative aspects, as shown in FIG. 4, RF Tx signal generator 400 may include a DPA 428 to generate the first wideband RF signal 426, for example, by modulating an amplitude of the first MOLO signal 427.

In some demonstrative aspects, as shown in FIG. 4, RF Tx signal generator 400 may include a DPA 438 to generate the second wideband RF signal 439, for example, by modulating an amplitude of the second MOLO signal 437.

In some demonstrative aspects, as shown in FIG. 4, RF Tx signal generator 400 may include a DPA 448 to generate the third wideband RF signal 449, for example, by modulating an amplitude of the interpolated MOLO signal 447.

In other aspects, RF Tx signal generator 400 may include a single DPA or any other count of DPAs, which may be configured to generate the wideband RF signals 429, 439 and/or 449.

In some demonstrative aspects, DFE 424 may be configured to control the one or more DPAs, e.g., DPA 428, DPA 438 and/or DPA 448, for example, based on the baseband signal 454.

In some demonstrative aspects, for example, DFE 424 may be configured to generate one or more control signals 435 to control DPA 428 to generate the wideband RF signal 429, to control DPA 438 to generate the wideband RF signal 439, and/or to control DPA 448 to generate the wideband RF signal 449, e.g., based on the baseband signal 454.

In some demonstrative aspects, RF Tx signal generator 400 may include a combiner 479, which may be configured to generate the wideband RF Tx signal 460 based, for example, on a combination of the first wideband RF signal 429, the second wideband RF signal 439, and the third wideband RF signal 449.

In some demonstrative aspects, combiner 479 may be configured to generate the wideband RF Tx signal 460 based, for example, on a summation of the first wideband RF signal 429, the second wideband RF signal 439, and the third wideband RF signal 449.

In other aspects, combiner 479 may be configured to generate the wideband RF Tx signal 460 based on any other combination of the first wideband RF signal 429, the second wideband RF signal 439, and the third wideband RF signal 449.

In some demonstrative aspects, as shown in FIG. 4, RF Tx signal generator 400 may be configured to generate the wideband RF Tx signal 460 based, for example, on an unfiltered PA output, e.g., the signal 429 output by DPA 428, the signal 439 output by DPA 438, and the signal 449 output by the DPA 448.

In some demonstrative aspects, as shown in FIG. 4, RF Tx signal generator 400 may be configured to generate the wideband RF Tx signal 460 including, for example, an unfiltered power-amplified Tx signal, e.g., prior to any filter mechanisms.

In some demonstrative aspects, as shown in FIG. 4, RF Tx signal generator 400 may be configured to provide a technical solution to generate the wideband RF Tx signal 460, for example, using a single DTC, e.g., DTC 426, and a phase shifter, e.g., phase shifter 420, to generate the MOLO signals 427 and 437 with the 90° phase difference.

In some demonstrative aspects, as shown in FIG. 4, RF Tx signal generator 400 may be configured to provide a technical solution to generate the wideband RF Tx signal 460, for example, using a DFE, for example, a single DFE, e.g., DFE 424, to calculate and/or control DTC and/or DPA commands.

In some demonstrative aspects, as shown in FIG. 4, RF Tx signal generator 400 may be configured to provide a technical solution to generate the wideband RF Tx signal 460, for example, with relatively high, e.g., close to optimal, harmonic suppression.

Reference is made to FIG. 5, which schematically illustrates a method of phase shifting, in accordance with some demonstrative aspects. For example, one or more operations of the method of FIG. 5 may be performed by one or more elements of a system, e.g., system 100 (FIG. 1), for example, a wireless device, e.g., device 102 (FIG. 1), a radio, e.g., radio 114 (FIG. 1), a transmitter, e.g., transmitter 118 (FIG. 1), a phase shifter, e.g., phase shifter 120 (FIG. 1), phase shifter 220 (FIG. 2), and/or phase shifter 320 (FIG. 3), and/or an RF Tx signal generator, e.g., RF Tx signal generator 400 (FIG. 4).

As indicated at block 502, the method may include receiving an input clock signal having an input frequency and an input phase. For example, phase shifter 120 (FIG. 1) may receive via input 113 (FIG. 1) the input clock signal 111 (FIG. 1) having the input frequency and the input phase, e.g., as described above.

As indicated at block 504, the method may include generating a first signal and a second signal based on the input clock signal, the first and second signals having the input frequency. For example, a phase of the first signal may be based on the input phase of the input clock signal, and a phase of the second signal may be shifted by a quadrature phase-shift relative to the phase of the first signal. For example, quadrature phase-shift generator 110 (FIG. 1) may be configured to generate the first signal 115 (FIG. 1) and the second signal 117 (FIG. 1) based on the input clock signal 115 (FIG. 1), e.g., as described above.

As indicated at block 506, generating the first signal and the second signal may include generating the quadrature phase-shift, for example, in a range of about 89-91 degrees, for example, for any input frequency in at least a frequency range between about 0.95*F and 1.05*F, wherein F denotes a frequency value. For example, quadrature phase-shift generator 110 (FIG. 1) may be configured to generate the signals 115 and 117 (FIG. 1) with quadrature phase-shift in the range of 89-91 degrees, for example, for any input frequency in at least the frequency range between 0.95*F and 1.05*F, e.g., as described above.

As indicated at block 508, the method may include providing an output based on the first signal and the second signal. For example, phase shifter 120 (FIG. 1) may provide the output 110 (FIG. 1) via output 119 (FIG. 1), for example, based on the first signal 115 (FIG. 1) and the second signal 117 (FIG. 1), e.g., as described above.

Figure 6:
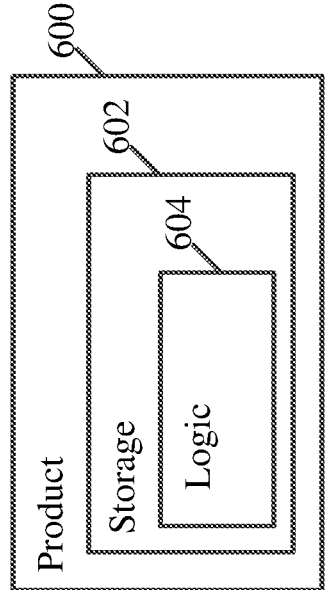
FIG. 6 is a schematic illustration of a product of manufacture, in accordance with some demonstrative aspects.

Reference is made to FIG. 6, which schematically illustrates a product of manufacture 600, in accordance with some demonstrative aspects. Product 600 may include one or more tangible computer-readable ("machine-readable") non-transitory storage media 602, which may include computer-executable instructions, e.g., implemented by logic 604, operable to, when executed by at least one computer processor, enable the at least one computer processor to implement one or more operations at device 102 (FIG. 1), a radio, e.g., radio 114 (FIG. 1), a transmitter, e.g., transmitter 118 (FIG. 1), a phase shifter, e.g., phase shifter 120 (FIG. 1), phase shifter 220 (FIG. 2), and/or phase shifter 320 (FIG. 3), and/or an RF Tx signal generator, e.g., RF Tx signal generator 400 (FIG. 4); to cause device 102 (FIG. 1), a radio, e.g., radio 114 (FIG. 1), a transmitter, e.g., transmitter 118 (FIG. 1), a phase shifter, e.g., phase shifter 120 (FIG. 1), phase shifter 220 (FIG. 2), and/or phase shifter 320 (FIG. 3), and/or an RF Tx signal generator, e.g., RF Tx signal generator 400 (FIG. 4), to perform, trigger and/or implement one or more operations and/or functionalities; and/or to perform, trigger and/or implement one or more operations and/or functionalities described with reference to the FIGS. 1, 2, 3, 4, and/or 5, and/or one or more operations described herein. The phrases "non-transitory machine-readable medium" and "computer-readable non-transitory storage media" may be directed to include all computer-readable media, with the sole exception being a transitory propagating signal.

In some demonstrative aspects, product 600 and/or machine-readable storage media 602 may include one or more types of computer-readable storage media capable of storing data, including volatile memory, non-volatile memory, removable or non-removable memory, erasable or non-erasable memory, writeable or re-writeable memory, and the like. For example, machine-readable storage media 602 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), flash memory (e.g., NOR or NAND flash memory), content addressable memory (CAM), polymer memory, phase-change memory, ferroelectric memory, silicon-oxide-nitride-oxide-silicon (SONOS) memory, a Solid State Drive (SSD), and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative aspects, logic 604 may include instructions, data, and/or code, which, if executed by a machine, may cause the machine to perform a method, process, and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative aspects, logic 604 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner, or syntax, for instructing a processor to perform a certain function. The instructions may be implemented using any suitable high-level, low-level, object-oriented, visual, compiled and/or interpreted programming language.

EXAMPLES

The following examples pertain to further aspects.

Example 1 includes an apparatus comprising a phase shifter comprising an input to receive an input clock signal having an input frequency and an input phase; a quadrature phase-shift generator configured to generate a first signal and a second signal based on the input clock signal, the first and second signals having the input frequency, wherein a phase of the first signal is based on the input phase, wherein a phase of the second signal is shifted by a quadrature phase-shift relative to the phase of the first signal, wherein the quadrature phase-shift generator is operable to generate the quadrature phase-shift in a range of 89-91 degrees for any input frequency in at least a frequency range between 0.95*F and 1.05*F, wherein F denotes a frequency value; and an output to provide an output based on the first signal and the second signal.

Example 2 includes the subject matter of Example 1, and optionally, wherein the quadrature phase-shift generator comprises an inverter to generate an inverted clock signal based on the input clock signal, wherein a phase of the inverted clock signal is shifted by 180 degrees relative to the input phase; a delayer to provide a delayed clock signal by applying a predefined delay to the input clock signal; and an interpolator to generate the second signal based on an interpolation of the delayed clock signal and the inverted clock signal.

Example 3 includes the subject matter of Example 2, and optionally, wherein the quadrature phase-shift generator comprises a first delayer to provide the first signal by applying half of the predefined delay to the input clock signal, and a second delayer to provide the delayed clock signal by applying half of the predefined delay to the first signal.

Example 4 includes the subject matter of Example 3, and optionally, wherein the predefined delay is Tc/2, wherein Tc denotes a chip period of the input clock signal.

Example 5 includes the subject matter of Example 3 or 4, and optionally, wherein the first signal and the second signal are delayed by Tc/4 relative to the input clock signal, wherein Tc denotes a chip period of the input clock signal.

Example 6 includes the subject matter of Example 2, and optionally, wherein the quadrature phase-shift generator comprises a first interpolator to provide the first signal based on an interpolation of the input clock signal and the delayed clock signal, and a second interpolator to provide the second signal based on an interpolation of the delayed clock signal and the inverted clock signal.

Example 7 includes the subject matter of Example 6, and optionally, wherein the predefined delay is Tc/4, wherein Tc denotes a chip period of the input clock signal.

Example 8 includes the subject matter of Example 6 or 7, and optionally, wherein the first signal and the second signal are delayed by Tc/8 relative to the input clock signal, wherein Tc denotes a chip period of the input clock signal.

Example 9 includes the subject matter of any one of Examples 2-8, and optionally, wherein the interpolator comprises an edge interpolator to generate the second signal based on an edge interpolation of edges of the delayed clock signal and edges of the inverted clock signal.

Example 10 includes the subject matter of Example 9, and optionally, wherein the interpolator comprises a 50% interpolator to interpolate 50% of an edge of the delayed clock signal and 50% of an edge of the inverted clock signal.

Example 11 includes the subject matter of any one of Examples 1-10, and optionally, wherein the quadrature phase-shift generator is operable to generate a first pair of signals having the quadrature phase-shift in the range of 89-91 degrees based on a first input clock signal having a first input frequency, and to generate a second pair of signals having the quadrature phase-shift in the range of 89-91 degrees based on a second input clock signal having a second input frequency, wherein the second input frequency is at least 1.1 times greater than the first input frequency.

Example 12 includes the subject matter of any one of Examples 1-11, and optionally, wherein the input clock signal comprises a Local Oscillator (LO) signal.

Example 13 includes the subject matter of any one of Examples 1-12, and optionally, wherein the input clock signal comprises a modulated clock signal.

Example 14 includes the subject matter of any one of Examples 1-13, and optionally, wherein the input clock signal comprises a Modulated Local Oscillator (MOLO) signal.

Example 15 includes the subject matter of Example 14, and optionally, comprising a Digital Time Converter (DTC) configured to generate the MOLO signal by modulating a phase of a Local Oscillator (LO) signal.

Example 16 includes the subject matter of any one of Examples 1-15, and optionally, wherein the quadrature phase-shift generator is operable to generate the quadrature phase-shift in a range of 89.5-90.5 degrees for any input frequency in at least the frequency range between 0.95*F and 1.05*F.

Example 17 includes the subject matter of any one of Examples 1-16, and optionally, wherein the quadrature phase-shift generator is operable to generate the quadrature phase-shift in a range of 89.9-90.1 degrees for any input frequency in at least the frequency range between 0.95*F and 1.05*F.

Example 18 includes the subject matter of any one of Examples 1-17, and optionally, wherein the quadrature phase-shift generator is operable to generate the quadrature phase-shift in the range of 89-91 degrees for any input frequency in at least a frequency range between 0.9*F and 1.1*F.

Example 19 includes the subject matter of any one of Examples 1-18, and optionally, wherein the quadrature phase-shift generator is operable to generate the quadrature phase-shift in the range of 89-91 degrees for any input frequency in at least a frequency range between 0.5*F and 1.5*F.

Example 20 includes the subject matter of any one of Examples 1-19, and optionally, wherein the quadrature phase-shift generator is operable to generate the quadrature phase-shift in the range of 89-91 degrees for any input frequency.

Example 21 includes the subject matter of any one of Examples 1-20, and optionally, wherein the frequency value F is at least 1 Gigahertz (GHz).

Example 22 includes the subject matter of any one of Examples 1-21, and optionally, wherein the frequency value F is at least 2.5 Gigahertz (GHz).

Example 23 includes the subject matter of any one of Examples 1-22, and optionally, comprising a transmitter comprising the phase shifter, wherein the transmitter is configured to transmit a Radio Frequency (RF) transmit signal based on the first and second signals.

Example 24 includes the subject matter of Example 23, and optionally, comprising an antenna to transmit the RF transmit signal.

Example 25 includes an apparatus comprising a phase shifter comprising an input to receive an input clock signal having an input frequency and an input phase; a quadrature phase-shift generator configured to generate a first signal and a second signal based on the input clock signal, wherein a phase of the first signal is based on the input phase, wherein a phase of the second signal is shifted by a quadrature phase-shift relative to the phase of the first signal, wherein the quadrature phase-shift generator comprises an inverter to generate an inverted clock signal based on the input clock signal, wherein a phase of the inverted clock signal is shifted by 180 degrees relative to the input phase; a delayer to provide a delayed clock signal by applying a predefined delay to the input clock signal; and an interpolator to generate the second signal based on an interpolation of the delayed clock signal and the inverted clock signal; and an output to provide an output based on the first signal and the second signal.

Example 26 includes the subject matter of Example 25, and optionally, comprising the phase shifter of any of Examples 1-24.

Example 27 comprises a wireless communication device comprising the apparatus of any one of Examples 1-26.

Example 28 comprises an apparatus comprising means for executing any of the described operations of Examples 1-26.

Example 29 comprises a product comprising one or more tangible computer-readable non-transitory storage media comprising computer-executable instructions operable to, when executed by at least one processor, enable the at least one processor to cause a device to perform any of the described operations of Examples 1-26.

Example 30 comprises an apparatus comprising: a memory interface; and processing circuitry configured to: perform any of the described operations of Examples 1-26.

Example 31 comprises a method comprising any of the described operations of Examples 1-26.

Functions, operations, components and/or features described herein with reference to one or more aspects, may be combined with, or may be utilized in combination with, one or more other functions, operations, components and/or features described herein with reference to one or more other aspects, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
a phase shifter comprising:
an input to receive an input clock signal having an input frequency and an input phase;
a quadrature phase-shift generator configured to generate a first signal and a second signal based on the input clock signal, the first and second signals having the input frequency, wherein a phase of the first signal is based on the input phase, wherein a phase of the second signal is shifted by a quadrature phase-shift relative to the phase of the first signal, wherein the quadrature phase-shift generator is operable to generate the quadrature phase-shift in a range of 89-91 degrees for any input frequency in at least a frequency range between 0.95*F and 1.05*F, wherein F denotes a frequency value; and
an output to provide an output based on the first signal and the second signal.

2. The apparatus of claim 1, wherein the quadrature phase-shift generator comprises:
an inverter to generate an inverted clock signal based on the input clock signal, wherein a phase of the inverted clock signal is shifted by 180 degrees relative to the input phase;
a delayer to provide a delayed clock signal by applying a predefined delay to the input clock signal; and
an interpolator to generate the second signal based on an interpolation of the delayed clock signal and the inverted clock signal.

3. The apparatus of claim 2, wherein the quadrature phase-shift generator comprises a first delayer to provide the first signal by applying half of the predefined delay to the input clock signal, and a second delayer to provide the delayed clock signal by applying half of the predefined delay to the first signal.

4. The apparatus of claim 3, wherein the predefined delay is Tc/2, wherein Tc denotes a chip period of the input clock signal.

5. The apparatus of claim 3, wherein the first signal and the second signal are delayed by Tc/4 relative to the input clock signal, wherein Tc denotes a chip period of the input clock signal.

6. The apparatus of claim 2, wherein the quadrature phase-shift generator comprises a first interpolator to provide the first signal based on an interpolation of the input clock signal and the delayed clock signal, and a second interpolator to provide the second signal based on an interpolation of the delayed clock signal and the inverted clock signal.

7. The apparatus of claim 6, wherein the predefined delay is Tc/4, wherein Tc denotes a chip period of the input clock signal.

8. The apparatus of claim 6, wherein the first signal and the second signal are delayed by Tc/8 relative to the input clock signal, wherein Tc denotes a chip period of the input clock signal.

9. The apparatus of claim 2, wherein the interpolator comprises an edge interpolator to generate the second signal based on an edge interpolation of edges of the delayed clock signal and edges of the inverted clock signal.

10. The apparatus of claim 9, wherein the interpolator comprises a 50% interpolator to interpolate 50% of an edge of the delayed clock signal and 50% of an edge of the inverted clock signal.

11. The apparatus of claim 1, wherein the quadrature phase-shift generator is operable to generate a first pair of signals having the quadrature phase-shift in the range of 89-91 degrees based on a first input clock signal having a first input frequency, and to generate a second pair of signals having the quadrature phase-shift in the range of 89-91 degrees based on a second input clock signal having a second input frequency, wherein the second input frequency is at least 1.1 times greater than the first input frequency.

12. The apparatus of claim 1, wherein the input clock signal comprises a Local Oscillator (LO) signal.

13. The apparatus of claim 1, wherein the input clock signal comprises a modulated clock signal.

14. The apparatus of claim 1, wherein the input clock signal comprises a Modulated Local Oscillator (MOLO) signal.

15. The apparatus of claim 14 comprising a Digital Time Converter (DTC) configured to generate the MOLO signal by modulating a phase of a Local Oscillator (LO) signal.

16. The apparatus of claim 1, wherein the quadrature phase-shift generator is operable to generate the quadrature phase-shift in a range of 89.5-90.5 degrees for any input frequency in at least the frequency range between 0.95*F and 1.05*F.

17. The apparatus of claim 1, wherein the quadrature phase-shift generator is operable to generate the quadrature phase-shift in the range of 89-91 degrees for any input frequency in at least a frequency range between 0.9*F and 1.1*F.

18. The apparatus of claim 1, wherein the frequency value F is at least 1 Gigahertz (GHz).

19. The apparatus of claim 1 comprising a transmitter comprising the phase shifter, wherein the transmitter is configured to transmit a Radio Frequency (RF) transmit signal based on the first and second signals.

20. The apparatus of claim 19 comprising an antenna to transmit the RF transmit signal.

21. An apparatus comprising:
a phase shifter comprising:
an input to receive an input clock signal having an input frequency and an input phase;
a quadrature phase-shift generator configured to generate a first signal and a second signal based on the input clock signal, wherein a phase of the first signal is based on the input phase, wherein a phase of the second signal is shifted by a quadrature phase-shift relative to the phase of the first signal, wherein the quadrature phase-shift generator comprises:
an inverter to generate an inverted clock signal based on the input clock signal, wherein a phase of the inverted clock signal is shifted by 180 degrees relative to the input phase;
a delayer to provide a delayed clock signal by applying a predefined delay to the input clock signal; and
an interpolator to generate the second signal based on an interpolation of the delayed clock signal and the inverted clock signal; and
an output to provide an output based on the first signal and the second signal.

22. The apparatus of claim 21, wherein the quadrature phase-shift generator comprises a first delayer to provide the first signal by applying half of the predefined delay to the input clock signal, and a second delayer to provide the delayed clock signal by applying half of the predefined delay to the first signal.

23. The apparatus of claim 21, wherein the quadrature phase-shift generator comprises a first interpolator to provide the first signal based on an interpolation of the input clock signal and the delayed clock signal, and a second interpolator to provide the second signal based on an interpolation of the delayed clock signal and the inverted clock signal.

24. An apparatus comprising:
phase shifter means comprising:
an input to receive an input clock signal having an input frequency and an input phase;
quadrature phase-shift generation means configured to generate a first signal and a second signal based on the input clock signal, the first and second signals having the input frequency, wherein a phase of the first signal is based on the input phase, wherein a phase of the second signal is shifted by a quadrature phase-shift relative to the phase of the first signal, wherein the quadrature phase-shift generation means is operable to generate the quadrature phase-shift in a range of 89-91 degrees for any input frequency in at least a frequency range between 0.95*F and 1.05*F, wherein F denotes a frequency value; and
an output to provide an output based on the first signal and the second signal.

25. The apparatus of claim 24, wherein the quadrature phase-shift generation means comprises:
means for generating an inverted clock signal based on the input clock signal, wherein a phase of the inverted clock signal is shifted by 180 degrees relative to the input phase;
means for providing a delayed clock signal by applying a predefined delay to the input clock signal; and
means for generating the second signal based on an interpolation of the delayed clock signal and the inverted clock signal.

* * * * *